(12) United States Patent
Hu et al.

(10) Patent No.: US 9,053,803 B2
(45) Date of Patent: Jun. 9, 2015

(54) INTEGRATED CIRCUIT AND METHOD FOR MANUFACTURING AND OPERATING THE SAME

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 91 days.

(21) Appl. No.: 14/060,645

(22) Filed: Oct. 23, 2013

(65) Prior Publication Data

US 2015/0109864 A1    Apr. 23, 2015

(51) Int. Cl.
G11C 5/06      (2006.01)
G11C 16/24     (2006.01)
H01L 23/528    (2006.01)
H01L 21/768    (2006.01)
G11C 16/04     (2006.01)

(52) U.S. Cl.
CPC ............. *G11C 16/24* (2013.01); *H01L 23/528* (2013.01); *H01L 21/76895* (2013.01); *G11C 16/0483* (2013.01)

(58) Field of Classification Search
USPC ................. 365/63, 185.17; 438/622; 257/773
See application file for complete search history.

(56) References Cited

U.S. PATENT DOCUMENTS 8,811,077 B2 *    8/2014   Hung et al. .............. 365/185.05

* cited by examiner

*Primary Examiner* — Fernando Hidalgo
(74) *Attorney, Agent, or Firm* — McClure, Qualey & Rodack, LLP

(57) ABSTRACT

An integrated circuit and methods for manufacturing and operating the same are provided. The integrated circuit comprises a fork architecture and a first conductive structure. The fork architecture comprises a handle portion and prong portions extending from the handle portion. The fork architecture comprises a stacked structure and a dielectric layer. The dielectric layer is between the first conductive structure and the handle portion of the stacked structure.

20 Claims, 10 Drawing Sheets

INTEGRATED CIRCUIT AND METHOD FOR MANUFACTURING AND OPERATING THE SAME

BACKGROUND

1. Technical Field

The disclosure relates to an integrated circuit and methods for manufacturing and operating the same, and more particularly to a memory and methods for manufacturing and operating the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, the scaling limitation of a memory cell size of this kind of the memory device is still bigger than 50 nm. It is not easy to breakthrough the limitation. The performance of the memory device may also be limited due to its element material.

SUMMARY

According to one aspect of the present disclosure, an integrated circuit is provided. The integrated circuit comprises a fork architecture and a first conductive structure. The fork architecture comprises a handle portion and prong portions extending from the handle portion. The fork architecture comprises a stacked structure and a dielectric layer. The dielectric layer is between the first conductive structure and the handle portion of the stacked structure.

According to another aspect of the present disclosure, a method for manufacturing an integrated circuit is provided. The method comprise following steps. A fork architecture is formed on a substrate. The fork architecture comprises a handle portion and prong portions extending form the handle portion. The fork architecture comprises a stacked structure and a dielectric layer formed on the stacked structure. A first conductive structure is formed on the dielectric layer. The dielectric layer is between the first conductive structure and the handle portions of the stacked structure.

According to yet another aspect of the present disclosure, an method for operating an integrated circuit is provided. The integrated circuit comprises a bit line and a first conductive structure. The bit line has a fork shape and comprises a handle portion and prong portions extending from the handle portion. The first conductive structure is on the handle portion of the bit line and functioned as a string select line. The method for operating the integrated circuit comprises following steps. A first voltage is applied to the first conductive structure to control the handle portion and the prong portions of the bit line to be in a selected state or an un-selected state.

The above and other aspects of the disclosure will become better understood with regard to the following detailed description of the non-limiting embodiment(s). The following description is made with reference to the accompanying drawings.

DETAILED DESCRIPTION

Figure 1:
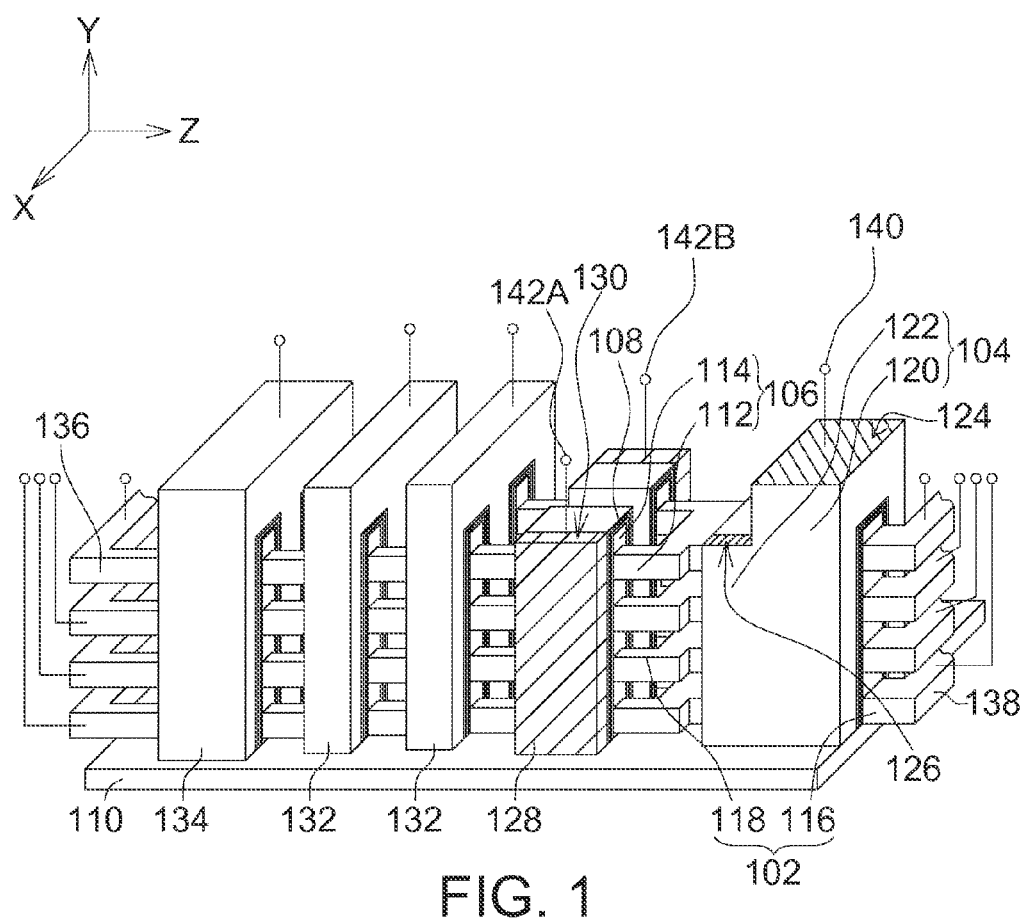
FIG. 1 shows an integrated circuit according to one embodiment.

Referring to FIG. 1, which shows an integrated circuit according to one embodiment, the integrated circuit comprises a fork architecture 102 and a first conductive structure 104.

The fork architecture 102 comprises a stacked structure 106 and a dielectric layer 108. The stacked structures 106 of different pages (for example extending in a Z direction are separated from each other and disposed on a substrate 110. The stacked structure 106 is formed by conductive strips 112 and dielectric strips 114 of straight strip shape, stacked in a stagger manner. The conductive strips 112 are not limited to four level layers as shown in FIG. 1, and may have other suitable level quantity, such as 8 level layers. The dielectric layer 108 is disposed on the stacked structure 106. The fork architecture 102 comprises a handle portion 116 and prong portions 118 extending from the handle portion 116. A quantity of the prong portions 118 extending from the single handle portion 116 is not limited to two, and may be other suitable quantity more than two.

The first conductive structure 104 is on the handle portion 116 of the dielectric layer 108, and separated from the conductive strip 112 of the stacked structure 106 by the dielectric layer 108. In this embodiment, the first conductive structure 104 comprises a first conductive portion 120 and a second conductive portion 122 adjacent to the first conductive portion 120. The first conductive portion 120 and the second conductive portion 122 are respectively away form and adjacent to the prong portion 118 of the fork architecture 102. An upper surface 124 of the first conductive portion 120 is higher than the fork architecture 102. An upper surface 126 of the second conductive portion 122 is as high as an upper surface of the fork architecture 102 (for example the dielectric layer 108 or the dielectric strip 114.

The integrated circuit may further comprise second conductive structures 128 respectively on outer side walls of the prong portions 118 separated from each other of the dielectric layer 108, and separated from the conductive strip 112 by the dielectric layer 108 of the fork architecture 102. In this embodiment, an upper surface 130 of the second conductive structure 128 is as high as the upper surface of the fork architecture 102 (for example, the dielectric layer 108 or the dielectric strip 114.

In one embodiment, the integrated circuit is a 3D memory stack such as a 3D vertical gate NAND flash, and further comprises conductive layers, comprising word lines (WL) 132 and a ground select line (GSL) 134, separated from each other, parallel with each other, and disposed on the prong portions 118 of the fork architecture 102. An extending direction (such as a X direction) of the conductive layers may be perpendicular to the extending direction (such as the X direction) of the prong portion 118. The integrated circuit may further comprise source pads 136 extended from the prong portions 118 of the conductive strips 112. The source pads 136 of different levels may be electrically connected to a common source line (CSL) through conductive plugs. The conductive strip 112 of the stacked structure 106 is functioned as a bit line. The first conductive structure 104 and the second conductive structure 128 are functioned as string select lines (SSL). The conductive strip 112 comprises a stair portion 138 extending from the handle portion 116. The stair portion 138 may be a common portion with another conductive strip of another fork architecture (not shown).

The dielectric strip 114 of the stacked structure 106, similar with the conductive strip 112, is a straight strip structure extended continuously. FIG. 1 does not show portions of the dielectric strip 114 among the first conductive structure 104, the second conductive structure 128, the word lines 132, the ground select line 134 and the source pads 136 for the sake of brevity of the integrated circuit of one embodiment.

An operating method for the integrated circuit comprises applying a first voltage 140 to the first conductive structure 104, to control the handle portion 116 and the prong portions 118 of the conductive strip (bit line) 112 to be in a selected (or "on") state or an un-selected (or "off") state. In addition, respectively applying second voltages 142A and 142B to the second conductive structures 128, to control the prong portions 118 of the conductive strip 112 adjacent to the second conductive structures 128 to be in a selected state or an un-selected state. According embodiments, the method for selecting pages is easy, and the memory array has high operating efficiency.

In one embodiment, a normal state of the first conductive structure 104 is designed to be in an "off" state (normally OFF) and a normal state of the second conductive structure 128 is designed to be in an "on" state (normally ON), for example by the first voltage 140 of a turning-off voltage and the second voltages 142A 142B of a turning-on voltages or floating, so as to make the whole fork conductive strip (bit line) 112 in an "on" state. In an operating step, during applying the first voltage 140 for turning on, the prong portion 118 of the conductive strip 112 may be controlled to be in an un-selected (or "off") state through the second conductive structure 128 adjacent to the prong portion 118. In another step, the whole fork conductive strip 112 may be controlled to be in an un-selected state through the first conductive structure 104. According embodiments, the method for selecting pages is easy, and the memory array has high operating efficiency.

Figure 2:
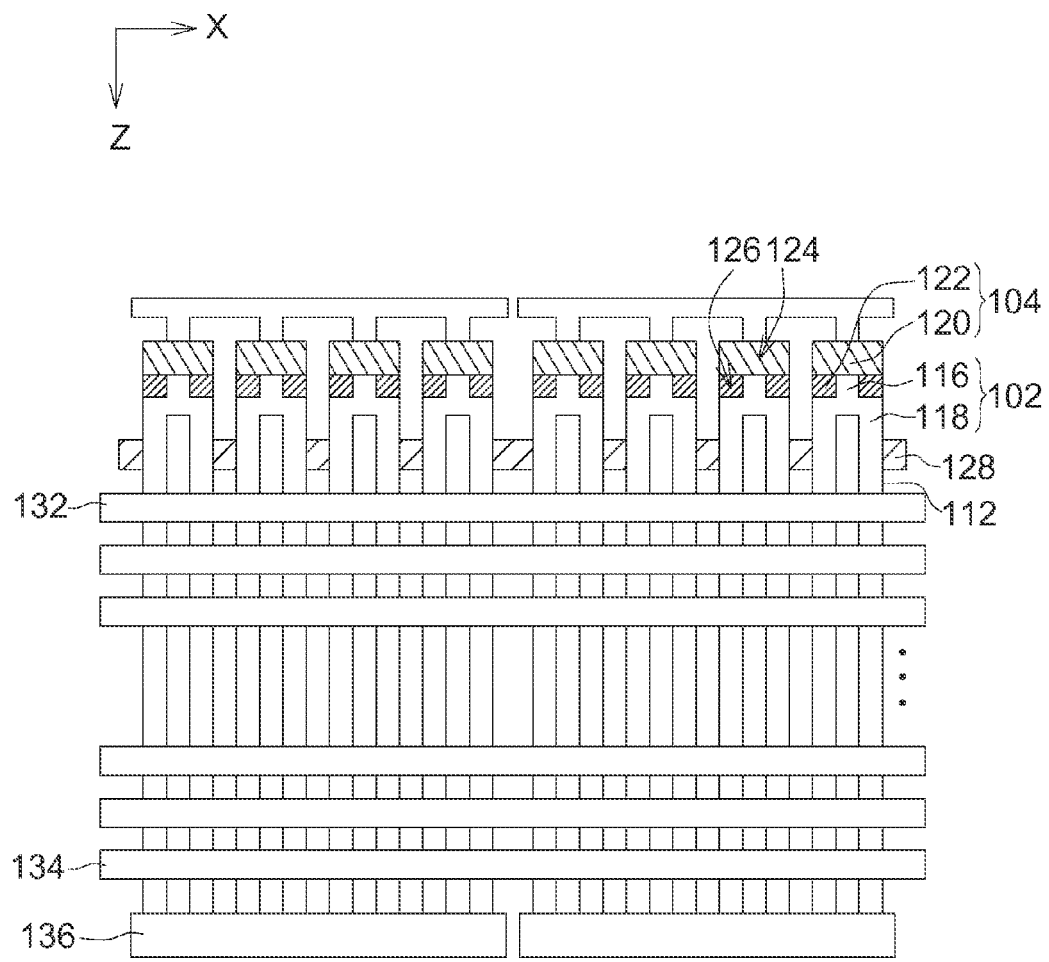
FIG. 2 is a top view of an integrated circuit according to one embodiment.

Referring to FIG. 2, which is a top view of an integrated circuit according to one embodiment. The integrated circuit has eight fork architectures 102. The first conductive structures 104, each comprising the first conductive portion 120 and the second conductive portion 122, are respectively on the handle portions 116 of the different fork architectures 102. The single second conductive structure 128 is adjoined between the prong portions 118 of two of the different fork architectures 102. In one embodiment, for example, a normal state of the first conductive structure 104 is designed to be in an "off" state (normally OFF) and a normal state of the second conductive structure 128 is designed to be in an on state (normally ON). In an operating step, during applying the first voltage 140 (FIG. 1) for turning on, the prong portion 118 of the conductive strip 112 may be optionally controlled to be in a selected state or an un-selected state through the second conductive structure 128 adjacent to the prong portion 118. For example, the fourth and fifth left-hand side prong portions 118 of the conductive strips 112 may be controlled to be in an un-selected state through the third left-hand side second conductive structure 128, and at the same time the others of the prong portions 118 of the conductive strips 112 away from the third left-hand side second conductive structure 128 is remained in an "on" state. In another step, at least one of the fork conductive strips 112 may be wholly controlled to be in an un-selected state through corresponding at least one of the first conductive structures 104. According embodiments, the method for selecting pages is easy, and the memory array has high operating efficiency.

Figure 3A:
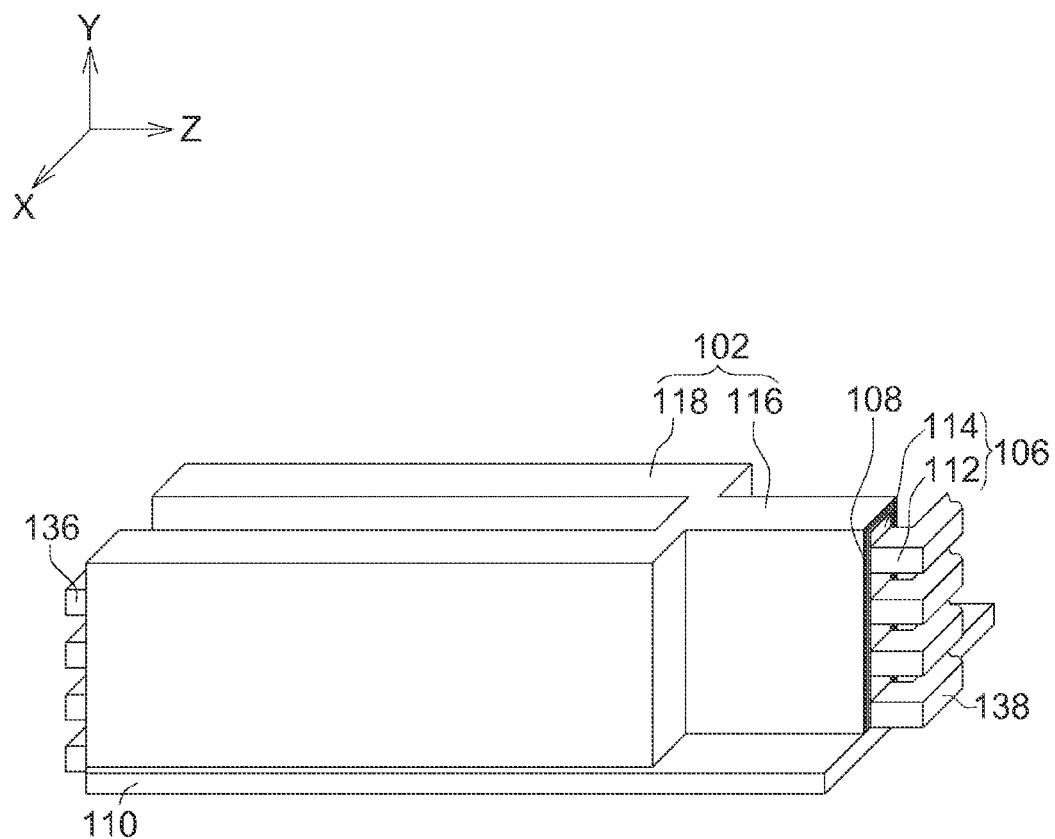
FIGS. 3A-3C illustrate a method for manufacturing an integrated circuit.
Figure 3B:
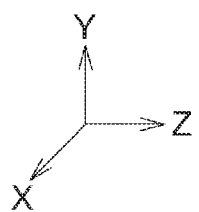
Figure 3B:
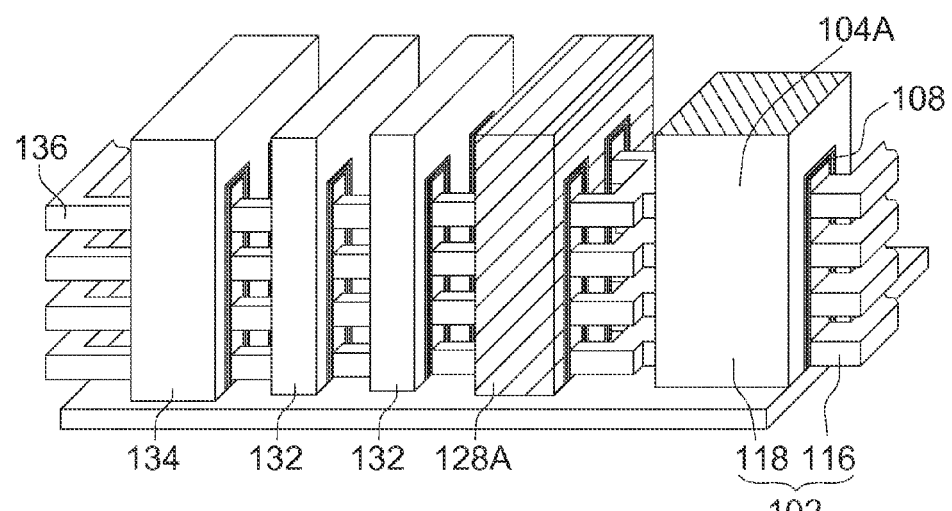
Figure 3C:
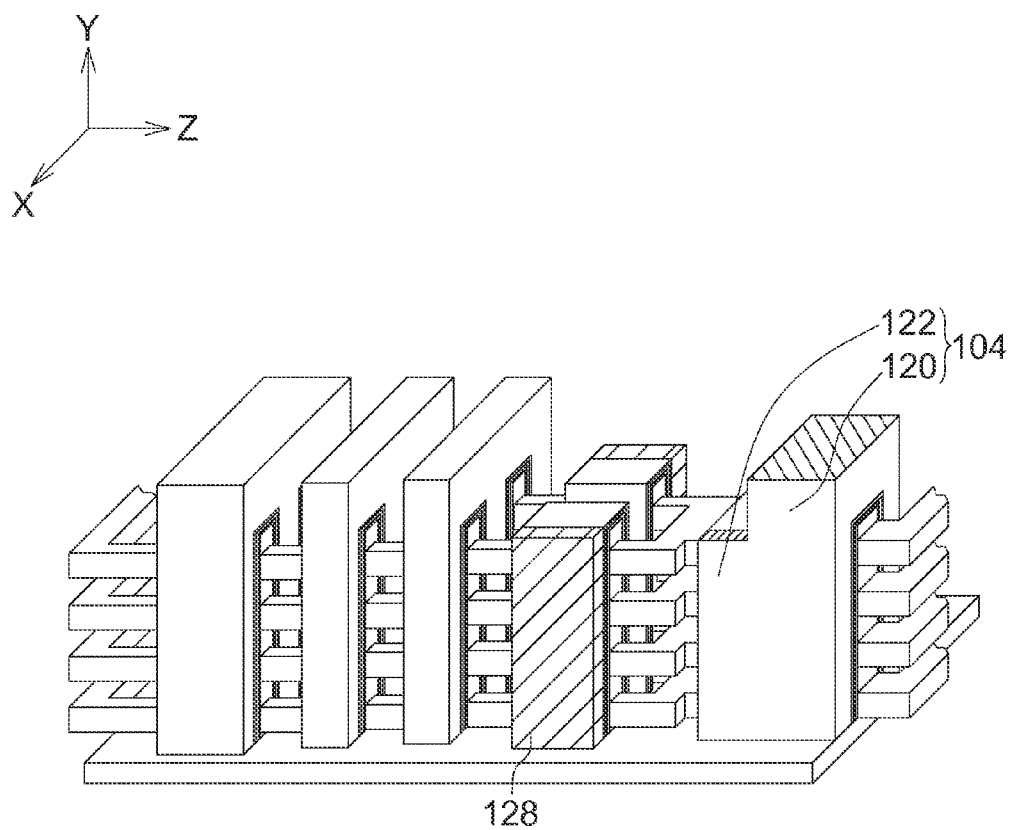

FIGS. 3A-3C illustrate a method for manufacturing an integrated circuit.

Referring to FIG. 3A, the stacked structure 106 is formed on the substrate 110. The stacked structure 106 of a fork shape comprises the handle portion 116 and the prong portions 118 extending from the handle portion 116. The stacked structure 106 may be formed by a method comprising stacking conductive films and dielectric films (not shown) in a stagger manner on the substrate 110 then pattering the conductive films and the dielectric films by a lithograph process to form the conductive strips 112 and the dielectric strips 114 of a fork shape. Then, the dielectric layer 108 is formed on the stacked structure 106. The stacked structure 106 and the dielectric layer 108 form the fork architecture 102. The conductive strips 112 may comprise a metal, a (for example doped) polysilicon, a metal silicide, or other suitable conductive materials. The dielectric strips 114 and the dielectric layer 108 may comprise silicon oxide, silicon nitride, silicon oxynitride, or other suitable dielectric materials. The dielectric layer 108 is not limited to ONO three-layer structure, and may use a single-layer or other suitable structures. In embodiments, the stacked structure 106, the source pads 136 and the stair portion 138 are formed simultaneously.

Referring to FIG. 3B, a first conductive structure 104A, a second conductive structure 128A and the conductive layers are formed on the dielectric layer 108. The conductive layers parallel with each other are disposed on the prong portions 118 of the fork architecture 102. The conductive layers comprise word lines 132 and the ground select line 134. The first conductive structure 104, the second conductive structure 128 and the conductive layers may be formed by a method comprising forming a conductive material (not shown) on the fork architecture 102, forming a patterned photoresist (not shown) on the conductive material, removing a portion of the conductive material not covered by the patterned photoresist and then removing the patterned photoresist.

Referring to FIG. 3C, a portion of the first conductive structure 104A (FIG. 3B) is removed to form the first conductive portion 120 and the second conductive portion 122. In addition, a portion of the second conductive structure 128A (FIG. 3B) is removed to form the second conductive structure 128. The first conductive structure 104 and the second conductive structure 128 may be formed by a method comprising forming a patterned photoresist (not shown) on the structure shown in FIG. 3B, removing portions of the first conductive structure 104A and the second conductive structure 128A not covered by the patterned photoresist, and then removing the patterned photoresist.

Figure 4:
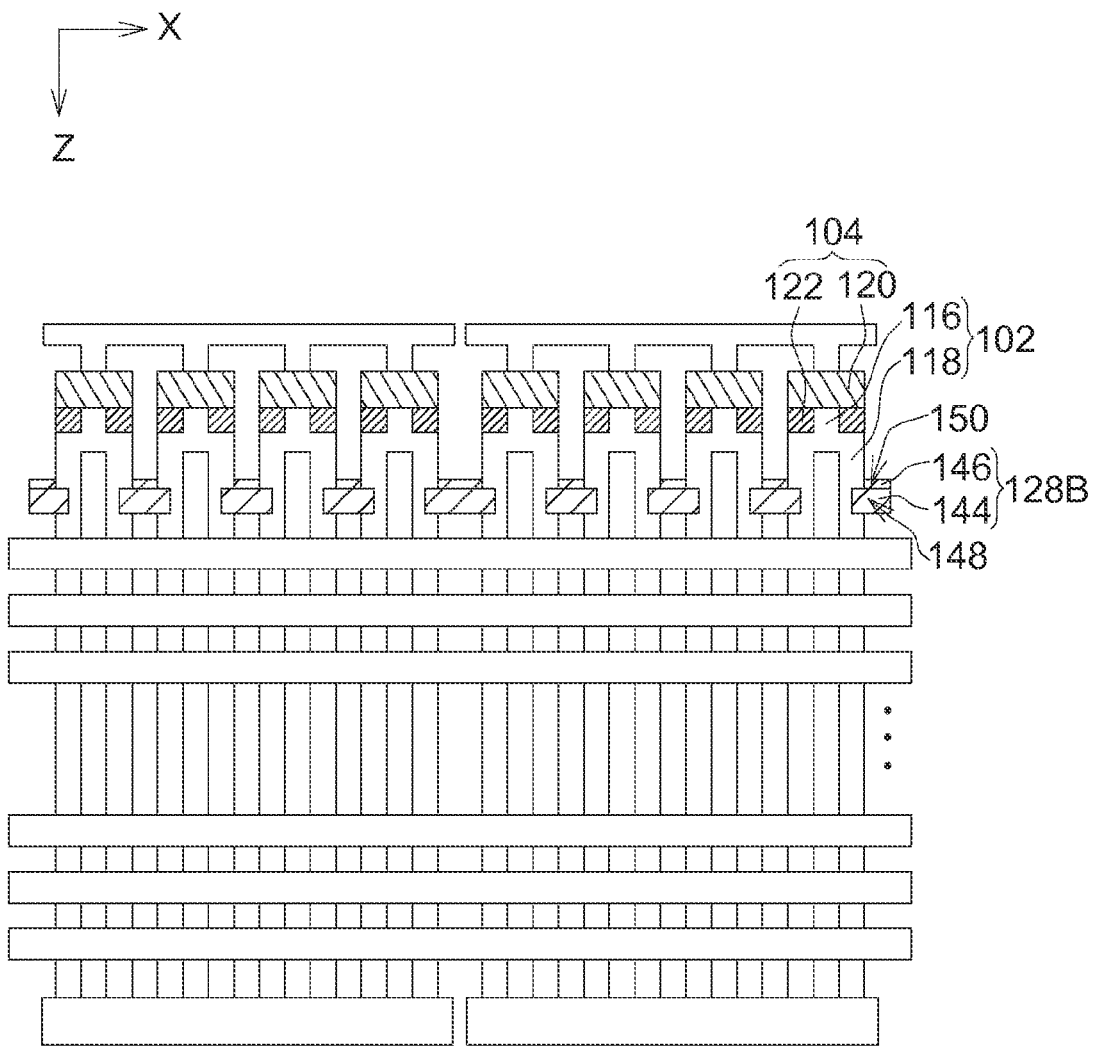
FIG. 4 is a top view of an integrated circuit according to one embodiment.

FIG. 4 shows a top view of an integrated circuit according to one embodiment. Differences between FIG. 2 and FIG. 4 are described as following. A second conductive structure 128B comprises a first conductive portion 144 and a second conductive portion 146 adjacent to the first conductive portion 144. The first conductive portion 144 and the second conductive portion 146 are respectively away from and adjacent to the handle portion 116 of the fork architecture 102. The first conductive portion 144 is extended on the upper surface of the fork architecture 102, and an upper surface 148 of the first conductive portion 144 is higher than the upper surface of the fork architecture 102. An upper surface 150 of the second conductive portion 146 is as high as the upper surface of the fork architecture 102. In one embodiment, this structure is resulted from a process shift from a desired structure as shown in FIG. 2, and a device has this structure remain desired operation efficiency. Therefore, in other words, the method and structure according to embodiments can suffer from a process shift, remain a good yield rate. The second conductive portion 122 of the first conductive structure 104 and the second conductive portion 146 of the second conductive structure 128B may be formed simultaneously by the same lithograph process.

Figure 5:
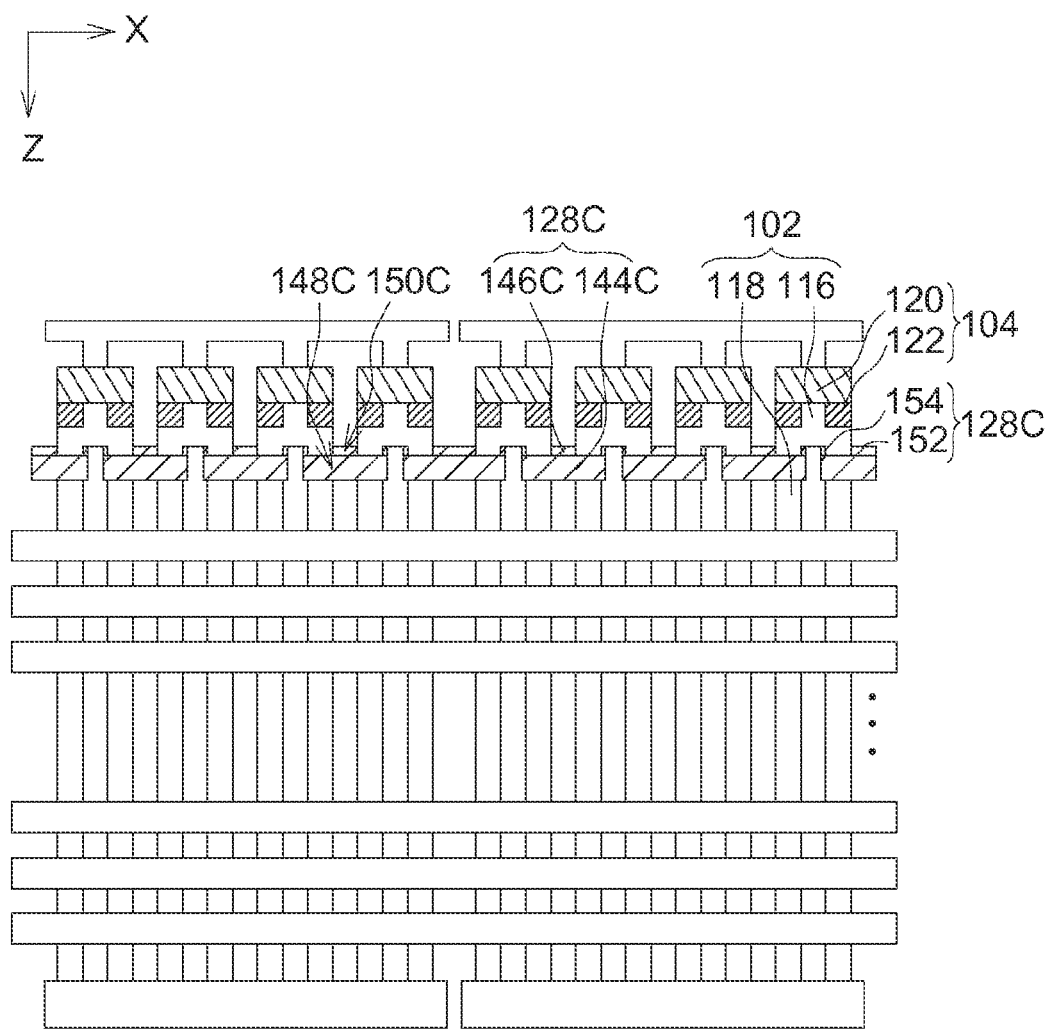
FIG. 5 is a top view of an integrated circuit according to one embodiment.

FIG. 5 shows a top view of an integrated circuit according to one embodiment. Differences between FIG. 5 and FIG. 2 are described as following. A second conductive structure 128C is extended onto an inner sidewall and an outer sidewall of the single prong portions 118. A portion 152 of the second conductive structure 128C on the outer sidewall of the single prong portions 118 is wider than a portion 154 of the second conductive structure 128C on the inner sidewall of the single prong portions 118. An area for controlling a state of the gate can be increased by the additional portion 152 on the outer side all. The second conductive structure 128C comprises a first conductive portion 144C and a second conductive portion 146C adjacent to the first conductive portion 144C. The first conductive portion 144C and the second conductive portion 146C are respectively away from and adjacent to the handle portion 116 of the fork architecture 102. The first conductive portion 144C is extended on the upper surface of the fork architecture 102, and an upper surface 150C of the first conductive portion 144C is higher than the upper surface of the fork architecture 102. An upper surface 150C of the second conductive portion 146C is as high as the upper surface of the fork architecture 102. The second conductive portion 122 of the first conductive structure 104 and the second conductive portion 146C of the second conductive structure 128C may be formed simultaneously by the same lithograph process.

Figure 6:
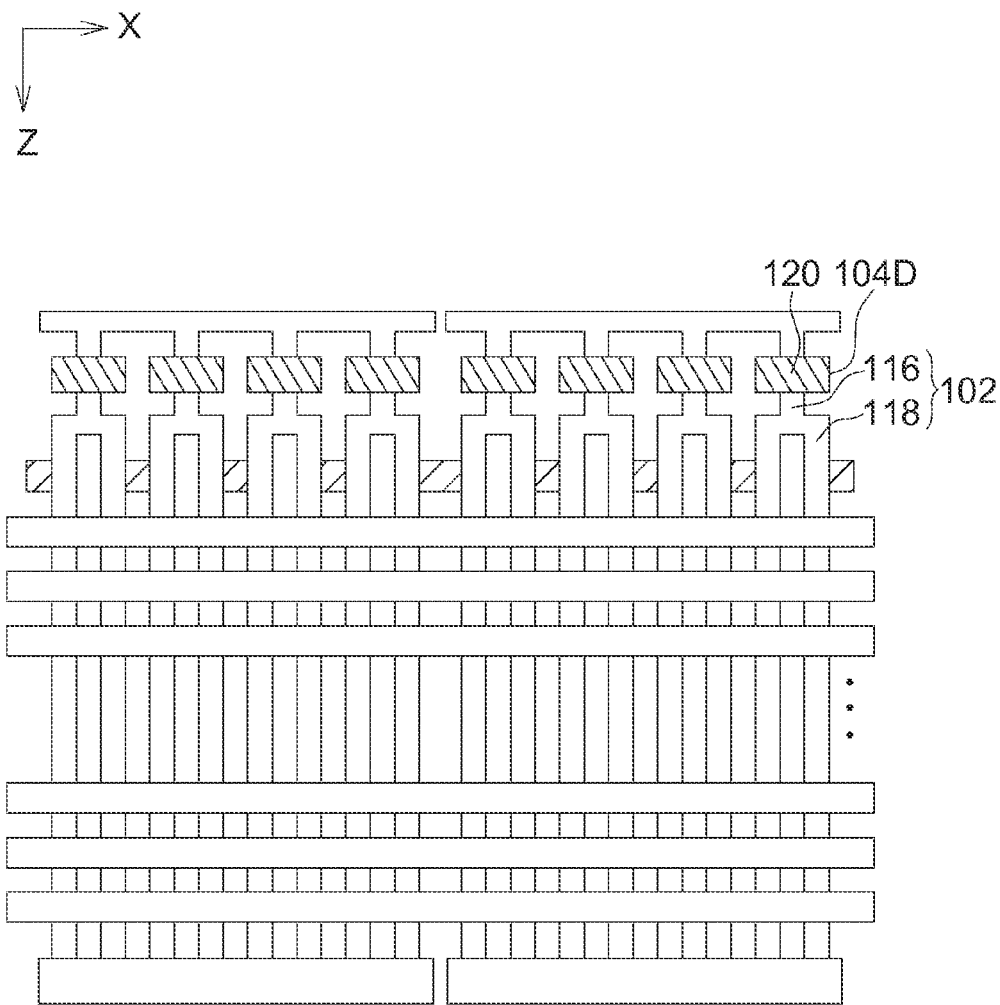
FIG. 6 is a top view of an integrated circuit according to one embodiment.

FIG. 6 shows a top view of an integrated circuit according to one embodiment. Differences between FIG. 6 and FIG. 2 are described as following. A first conductive structure 104D has only the first conductive portion 120 higher than the fork architecture 102, and the second conductive portion 122 (FIG. 2) is omitted.

Figure 7:
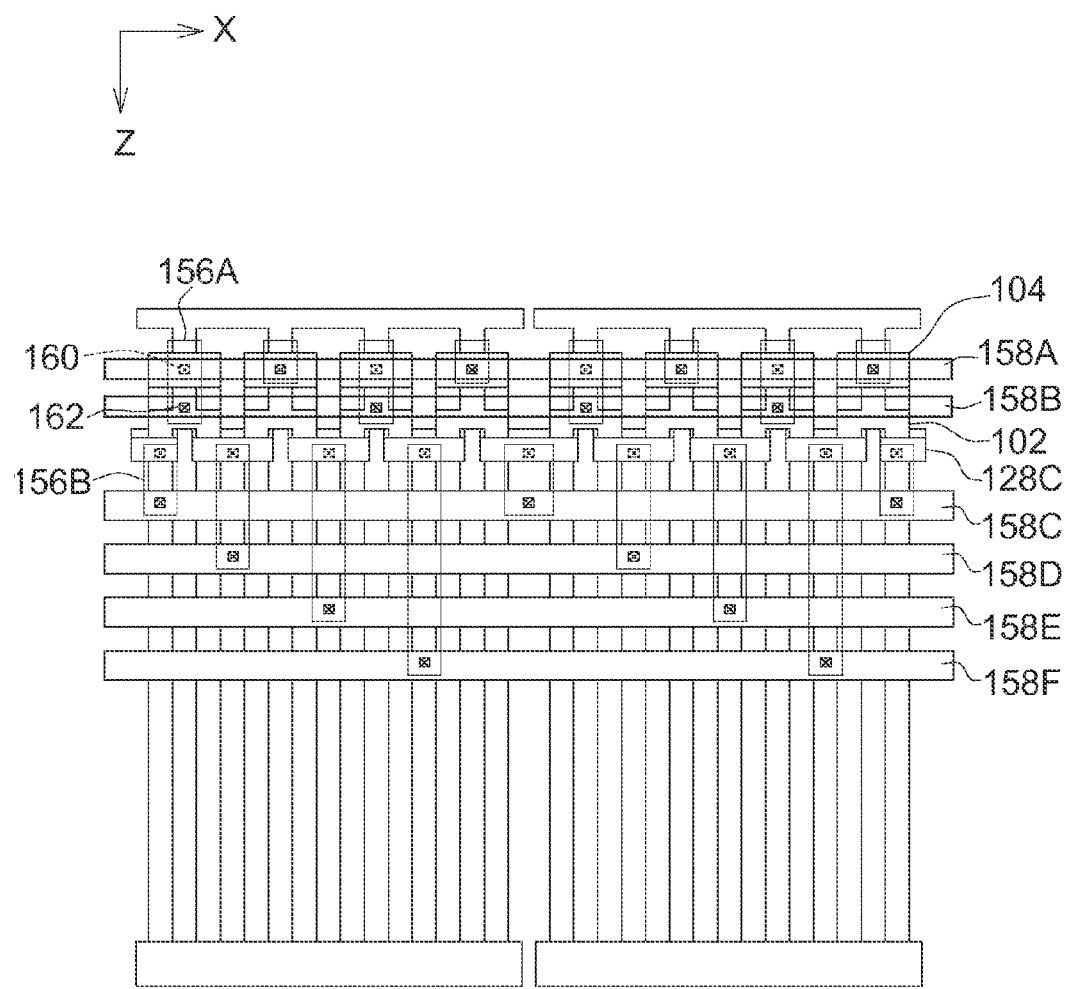
FIG. 7 is a top view of an integrated circuit according to one embodiment.

FIG. 7 is a top view of an integrated circuit according to one embodiment, which does not show the word lines 132 and the ground select line 134 as shown in FIG. 2 for the sake of brevity. Each of two array groups comprises four fork architectures 102. The two array groups use common second level conductive lines (M2) 158A-158F above the conductive layers. The first conductive structures 104 and the second conductive structures 128C are respectively electrically connected to the second level conductive lines 158A-158F through first conductive plugs 160 electrically connected between the first conductive structures 104/the second conductive structures 128C and first level conductive lines 156A-156B, and second conductive plugs 162 electrically connected between the first level conductive lines 156A-156B and the second level conductive lines 158A-158F. In this case, the first conductive structures 104 are electrically connected to the second level conductive line 158A and the second level conductive line 158B in turn. The second conductive structures 128C of the each array group are electrically connected to second level conductive lines 158C to 158F one by one.

Figure 8:
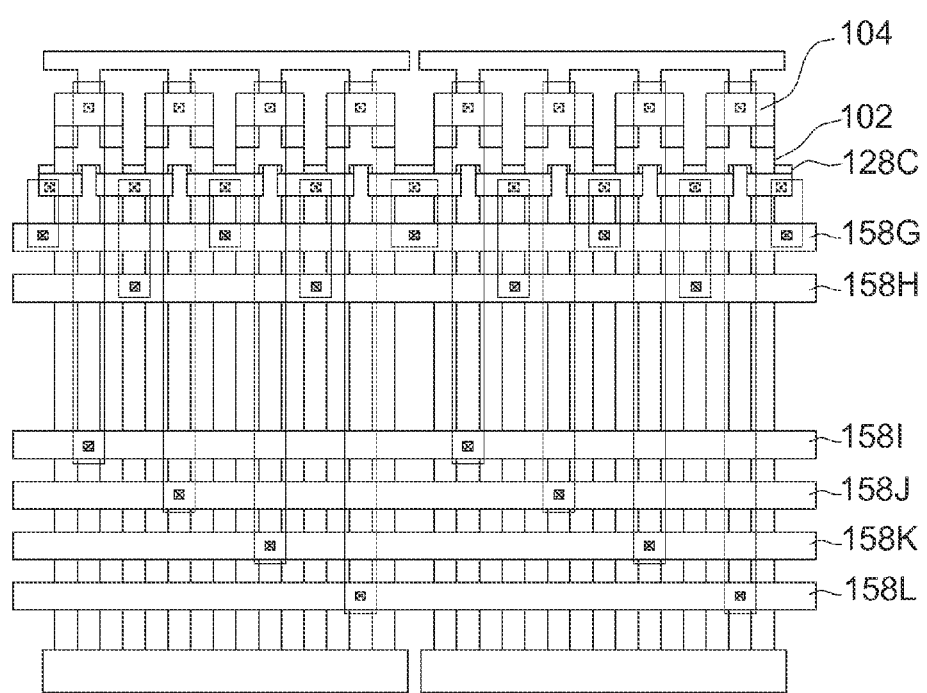
FIG. 8 is a top view of an integrated circuit according to one embodiment.

FIG. 8 shows a top view of an integrated circuit according to one embodiment. Differences between FIG. 8 and FIG. 7 are described as following. The second conductive structures 128C are electrically connected to the second level conductive line 158G and the second level conductive line 158H in turn. The first conductive structures 104 of the each array group are electrically connected to second level conductive lines 158I to 158L one by one.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit, comprising:
   a fork architecture comprising a handle portion and prong portions extending from the handle portion, and comprising a stacked structure and a dielectric layer; and
   a first conductive structure, wherein the dielectric layer is between the first conductive structure and the handle portion of the stacked structure.

2. The integrated circuit according to claim 1, wherein an upper surface of the first conductive structure is higher than or as high as an upper surface of the fork architecture.

3. The integrated circuit according to claim 1, wherein the first conductive structure a first conductive portion and a second conductive portion adjacent to the first conductive portion, the first conductive portion and the second conductive portion are respectively away from and adjacent to the prong portions of the fork architecture.

4. The integrated circuit according to claim 3, wherein an upper surface of the first conductive portion is higher than the fork architecture, an upper surface of the second conductive portion is as high as an upper surface of the fork architecture.

5. The integrated circuit according to claim 1, further comprising a second conductive structure, wherein the dielectric layer is between the second conductive structure and the prong portion of the stacked structure.

6. The integrated circuit according to claim 1, further comprising second conductive structures respectively on the different prong portions.

7. The integrated circuit according to claim 1, comprising a plurality of the fork architectures and a second conductive structure, wherein the single second conductive structure is between the prong portions of the different fork architectures.

8. The integrated circuit according to claim 1, further comprising a second conductive structure on one of the prong portions of the fork architecture, wherein an upper surface of the second conductive structure is higher than or as high as an upper surface of the fork architecture.

9. The integrated circuit according to claim 1, wherein the integrated circuit is a 3D memory stack, and further comprises a second conductive structure, the stacked structure comprising a conductive strip of a fork shape, the first conductive structure is used for controlling the conductive strip of the fork shape to be in a selected state or an un-selected state, the second conductive structure is used for controlling one of the prong portions of the conductive strip of the fork shape to be in a selected state or an un-selected state.

10. The integrated circuit according to claim 1, further comprising:

conductive layers parallel with each other and on the prong portions of the fork architecture, wherein the conductive layers comprise a word line (WL) and/or a ground select line (GSL); and source pads extended form the prong portions of the fork architecture and electrically connected to a common source line (CSL).

11. The integrated circuit according to claim 10, further comprising a second conductive structure on the prong portions, wherein the first conductive structure and the second conductive structure are functioned as string select lines (SSL), the second conductive structure is between the first conductive structure and the word lines, the ground select line is between the source pads and the word lines.

12. The integrated circuit according to claim 1, comprising a plurality of the first conductive structure separated from each other and a plurality of the fork architectures separated from each other, wherein the first conductive structures are respectively on the handle portions of the different fork architectures.

13. The integrated circuit according to claim 1, wherein the integrated circuit is a 3D memory stack, the stacked structure comprises bit lines separated from each other, the first conductive structure is functioned as a string select line for controlling the bit lines of a fork shape to be in a selected state or an un-selected state.

14. The integrated circuit according to claim 1, wherein the stacked structure is formed by stacking conductive strips and dielectric strips in a stagger manner.

15. A method for manufacturing an integrated circuit, comprising:
   forming a fork architecture on a substrate, wherein the fork architecture comprises a handle portion and prong portions extending form the handle portion, and comprises a stacked structure and a dielectric layer formed on the stacked structure; and
   forming a first conductive structure on the dielectric layer, wherein the dielectric layer is between the first conductive structure and the handle portions of the stacked structure.

16. The method for manufacturing the integrated circuit according to claim 15, further comprising forming second conductive structures respectively on the different prong portions.

17. The method for manufacturing the integrated circuit according to claim 15, further comprising:
   forming conductive layers parallel with each other and on the prong portions of the fork architecture, wherein the conductive layers comprise a word lines and/or a ground select line; and
   forming source pads extending from the prong portions of the fork architecture, wherein the integrated circuit is a 3D memory stack.

18. A method for operating an integrated circuit, wherein the integrated circuit comprises:
   a bit line having a fork shape and comprising a handle portion and prong portions extending from the handle portion; and
   a first conductive structure on the handle portion of the bit line and functioned as a string select line, the method for operating the integrated circuit comprises:
   applying a first voltage to the first conductive structure to control the handle portion and the prong portions of the bit line to be in a selected state or an un-selected state.

19. The method for operating the integrated circuit according to claim 18, wherein the integrated circuit further comprises a second conductive structure on at least one of the prong portions of the bit line and functioned as a string select line,
   the method for operating the integrated circuit comprises applying a second voltage to the second conductive structure to control the at least one of the prong portions of the bit line adjacent to the second conductive structure to be in a selected state and an un-selected state.

20. The method for operating the integrated circuit according to claim 18, wherein the integrated circuit further comprises second conductive structures respectively on the prong portions of the bit line and functioned as string select lines,
   the method for operating the integrated circuit comprises:
   applying second voltages to the second conductive structure to respectively control the prong portions of the bit line adjacent to the second conductive structure to be in a selected state or an un-selected state.

* * * * *